United States Patent [19]

Wood et al.

[11] Patent Number: 5,449,910
[45] Date of Patent: Sep. 12, 1995

[54] INFRARED RADIATION IMAGING ARRAY WITH COMPOUND SENSORS FORMING EACH PIXEL

[75] Inventors: Roland A. Wood, Bloomington; Robert E. Higashi, Shorewood; Michael L. Rhodes, Richfield, all of Minn.

[73] Assignee: Honeywell Inc., Minneapolis, Minn.

[21] Appl. No.: 153,066

[22] Filed: Nov. 17, 1993

[51] Int. Cl.⁶ .................................. G01J 5/14
[52] U.S. Cl. ........................ 250/338.1; 250/338.4
[58] Field of Search ..................... 250/338.4, 338.1

[56] References Cited

U.S. PATENT DOCUMENTS

| | | | |
|---|---|---|---|
| Re. 32,779 | 11/1988 | Kruger | 378/19 |
| 3,644,913 | 2/1972 | Matsui | 340/588 |
| 3,943,553 | 3/1976 | Elfving et al. | 136/211 |
| 4,343,960 | 8/1982 | Eguchi et al. | 136/225 |
| 4,558,342 | 12/1985 | Sclar | 257/460 |
| 4,634,883 | 1/1987 | Nishiura et al. | 358/482 |
| 4,862,237 | 8/1989 | Morozumi | 257/72 |
| 4,878,121 | 10/1989 | Hynnecek | 348/319 |
| 4,962,303 | 10/1990 | Chu | 250/208.1 |
| 5,010,251 | 4/1991 | Grinberg et al. | 250/332 |

FOREIGN PATENT DOCUMENTS 3-125935  5/1991  Japan ..................... 250/338.1

*Primary Examiner*—Constantine Hannaher
*Attorney, Agent, or Firm*—Edward L. Schwarz

[57] ABSTRACT

An infrared imaging array of thermoelectric sensors has a plurality of electrically connected microbridge subsensors comprising each sensor of the array. Each subsensor consists of a short span microbridge lying across a relatively small pit. The use of many of such subsensors for each sensor rather than a single large area microbridge sensor for a single pixel allows each pixel to be made large enough to give good sensitivity in either vacuum or gas-filled designs, and at the same time avoid the reduced fabrication yield which results when sensors span large pits.

5 Claims, 2 Drawing Sheets

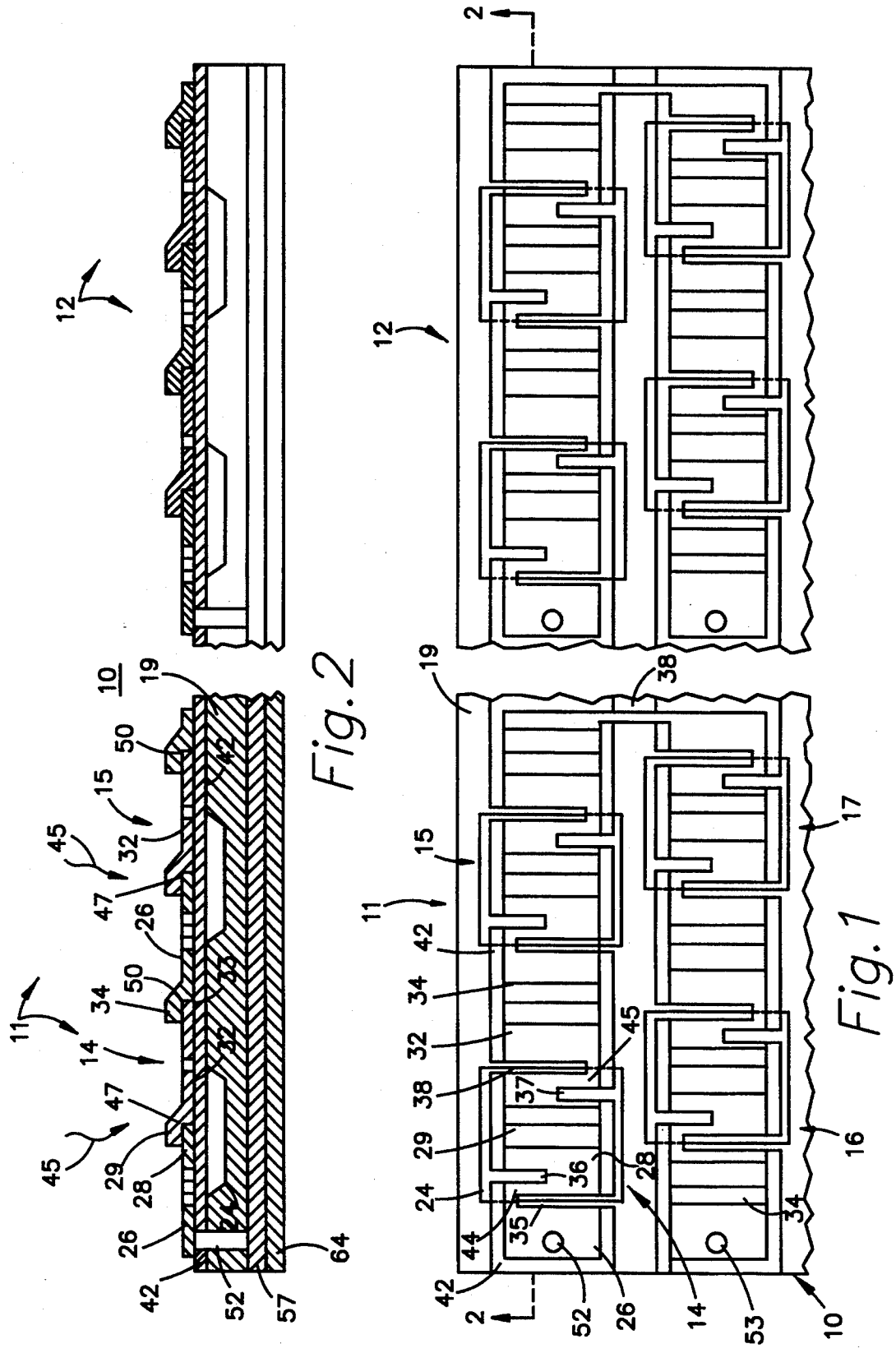

INFRARED RADIATION IMAGING ARRAY WITH COMPOUND SENSORS FORMING EACH PIXEL

The U.S. Government has rights in this invention pursuant to Contract No. U0121 entered into Jul. 12, 1989, with the assignee of this patent.

BACKGROUND OF THE INVENTION

Quite sensitive and small infrared (IR) sensors which operate on the principles of a thermopile are now available. Such sensors provide a small electrical signal which varies with the relative strength of the IR radiation impinging on them, and can be used to measure the temperature or change in temperature of an object on which a sensor of this type is focussed. The most sensitive of these sensors can detect differences in temperature of a few thousandths of a degree Celsius in the object from which the IR radiation emanates. Using common photolithographic processes, such sensors can easily be fabricated in situ in a matrix or array, each sensor forming one of the pixels in the array.

It is known that most objects emit amounts and frequencies of infrared radiation which differ based on the emissivity, angle of the surface to the viewer, and temperature of the body itself. The variations in this radiation when allowed to impinge on an array of IR sensors produces corresponding differences in the signals from the individual sensor elements in the array. The individual signals from the sensors in the array can therefore collectively encode an image of the field of view from which the IR radiation emanates. Typically, the individual output signals from the sensors are scanned in some sequential manner to form a composite signal encoding the image and changes in it in real time. In this way, such an array can form the IR radiation-sensitive, image-forming element of a camera which produces images based on the infrared radiation emanating from the field of view. The signal can be used to form a visible image in a display which accurately represents the spatial relationship of objects in the field. Such encoding of an image has been done for many decades in the imaging of visible light from a field of view as in television technology.

A recently developed preferred design for IR sensors depending on a thermoelectric mechanism to provide the signal voltage output, has thin layers of conductive materials of various types and insulating material which are deposited in appropriate patterns on a silicon sensor substrate using well-known photolithographic techniques. Thermoelectric junctions are formed by overlapping conductors during the deposition. Such sensors will be called hereafter microbridge sensors. The junctions of these microbridge sensors are of two kinds, sensor junctions and reference junctions. The reference junctions are in close thermal contact with the substrate. Each sensor junction is within a small, discrete, area which overlays a pit or depression formed in the sensor substrate, and is of an area conforming to the footprint of the sensor junction. In cross section, these sensors look much like a bridge spanning a valley, hence the term "microbridge". The pits provide a measure of thermal isolation from the substrate for their associated sensor junctions. Thus, changing IR radiation impinging on both the sensor and reference junctions causes the temperature of the sensor junction to change more rapidly than does the reference junction, resulting in a temperature differential between the junctions which generates a signal. These known photolithographic techniques allow individual sensors to be easily fabricated in an array so as to allow imaging of the IR radiation in a field of view. Leads from the elements forming the junctions are led to electronic circuitry which may be formed in layers below the sensor substrate. This circuitry scans and amplifies the signals from the individual sensors to provide a signal which may be used to reproduce the field of view in a way analogous to that of television.

For maximum sensitivity microbridge sensors may be maintained in a low pressure gas atmosphere or in a vacuum by virtue of reduced heat transfer between the sensing junction and the substrate, but this requires a hermetically sealed enclosure which adds cost and reduces reliability. It is also possible to use a less tightly sealed enclosure containing air or other gas at or near atmospheric pressure, at the cost of less sensitivity. One should realize that these microbridge sensors are designed to produce a usable signal with but a few hundredths or thousandths of a degree Celsius temperature differential between the sensing and reference junctions.

One desirable application for these sensors is in arrays for forming images of relatively low contrast scenes or fields of view, such as may arise indoors in occupied rooms. In such fields of view, the inanimate, non-heat producing objects are all very nearly at the same temperature. Distinguishing such objects by use of IR imaging requires very sensitive sensors. The types of microbridge IR sensors formed according to today's technology cannot provide the high quality signals, i.e. resolve contrasts in impinging radiation adequately so as to clearly distinguish the typical variations in IR radiation in low contrast fields of view unless the total area of each individual sensor pixel is larger than a certain minimum area. Typically, a 6 mil×6 mil (0.15 cm×0.15 cm) or equivalent area is required for vacuum-packaged sensors. Even larger areas are required for sensors operating in gas-filled packages. Sensors having such areas are too large to reliably fabricate using current processes. In essence, the span necessary for the bridge which supports the sensing junction is too great for reliable fabrication and adequate resistance to shock and vibration.

BRIEF DESCRIPTION OF THE INVENTION

We have found that the capabilities of large area microbridge sensors can be duplicated with satisfactory yields by instead using a group of adjacent small microbridge sensors whose aggregate area is similar to that of a single large sensor. Each such group of sensors forms a single pixel for imaging purposes. The sensitivity of the device is not reduced significantly by the use of a number of smaller sensors instead of a single large one of similar area. The small microbridge sensors in a single group are connected electrically in series or parallel to form an equivalent large sensor. These smaller sensors need span only a small pit which thermally isolates the sensing junction, and this can be done with much higher fabrication yields. Further, if an occasional smaller sensor is defective, others in a single group will still provide a signal which can if necessary be enhanced so as to provide at least some contribution to the image. This approach allows the individual pixel area to be made as large as is desired for adequate sensitivity and resolution. Each sensor may have as few as three or four subsensors or as many as thousands.

The small microbridge sensors form in effect a subarray of subsensors which are connected electrically to form a single large area sensor of the required sensitivity. Each of the large sensor elements so formed may itself be arranged in an array of these larger sensors to allow an image of impinging radiation to be formed.

Such an infrared radiation sensing array comprises a substrate having on a first surface, a plurality of pixel areas arranged in an array. Within each pixel area, a plurality of infrared radiation voltaic microbridge subsensors are arranged in a sub-array to comprise a single sensor. Each subsensor has first and second output terminals across which appears a voltage responsive to changes in infrared radiation impinging on the subsensor. A plurality of conductors connect the subsensors of each sensor together in a predetermined manner so as to provide a composite signal to which each subsensor contributes. The composite signal from each sensor is provided on its own conductor to a signal processor. Each composite signal has the information content that would be provided by a single large sensor occupying essentially the same space in the array.

The subsensors comprising a sensor may be connected in either series or parallel as desired so as to match the input impedance of the amplifier to which they are connected. Most conveniently, all of the subsensors forming a sensor may be arranged in an orthogonal array within the pixel area and connected in a series arrangement with the voltage output and internal impedance of each additive to that of all the others comprising the sensor. To achieve this, the subsensors in each row of the pixel area array are connected in series, and the rows of series-connected subsensors are then connected in series with each other as well to create a series connection of all of the subsensors wherein the signal voltages of the sensors are additive.

BRIEF DESCRIPTION OF THE DRAWINGS

FIG. 1 is a plan view of an infrared sensor array built according to the invention of this application.

FIG. 2 is a cross section view of two adjacent pixel areas from the array of FIG. 1, and is aligned so that the individual features of FIGS. 1 and 2 are vertically aligned.

DESCRIPTION OF THE PREFERRED EMBODIMENTS

Figure 3:
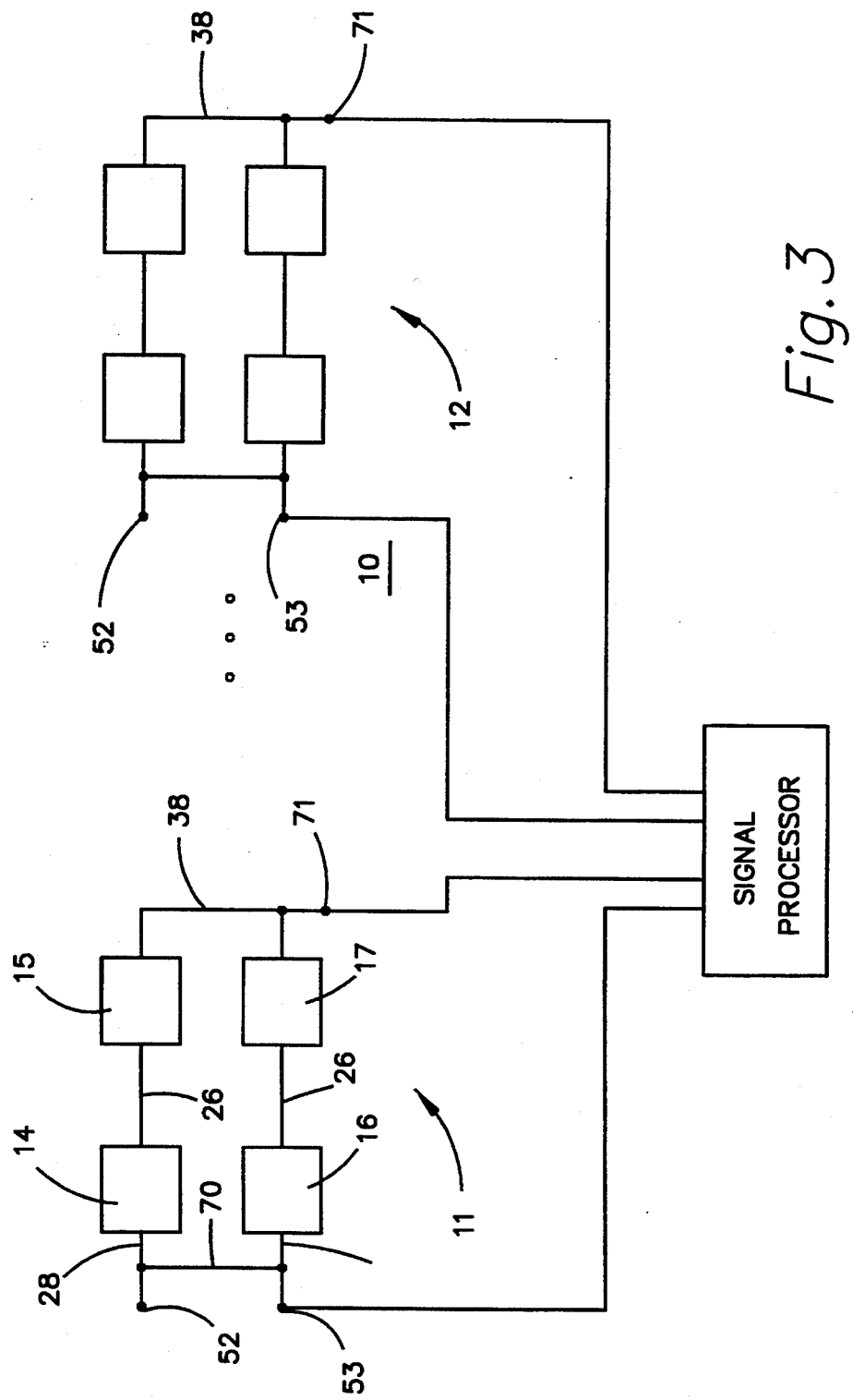
FIG. 3 shows an alternative connection between the subsensors of an infrared radiation sensor array.

FIGS. 1 and 2, which are different views of the same array device 10, will be described together. In FIG. 1, there are shown two separate pixel areas located at the upper left hand and upper right hand corners respectively of a representative infrared imaging array. There may be as many as several hundred pixel areas in a single row of an array, and there may be several hundred rows as well in a high resolution array 10. Each pixel area contains a single composite sensor 11, 12, etc. formed by photolithographic processes. The entire array 10 is carried on a base 64, which typically will be formed of a silicon material and cut from a larger silicon wafer. The array 10 is formed in and on a thermally conductive heat sink layer 19. It is possible to form electrical components and connections beneath heat sink layer 19 within a group of contiguous component layers 57 deposited on base 64. The individual components within component layers 57 if present, as well as the connections between them, will typically also be formed by these well-known photolithographic processes. These components and their connections can form circuits for processing the signals provided by individual sensors 11, 12, etc.

For exemplary purposes, FIGS. 1 and 2 show individual sensors 11 and 12, with sensor 11 shown as comprising four essentially identical individual subsensors 14–17. In point of fact sensor 11 may comprise as few as three or four subsensors 14–17 or as many as thousands of subsensors. The number of subsensors 14–17 depends on the sensitivity and resolution required and whether the array 10 is of the vacuum or gas-filled type. Each subsensor 14–17 comprises a complete microbridge infrared sensor with a sensing junction 47 and a reference junction 50 as is shown for subsensor 14. With present technology, each sensor 11, 12, etc. may occupy a pixel area which is on the order of 6 mils (0.15 mm) square. Within each pixel area, the individual subsensors 14–17 may be arranged in orthogonal rows and columns as shown, although other spatial arrangements are possible as well. The subsensors 14–17 are formed and supported on a thin layer 42 comprising an electrically insulating material such as photoresist having relatively good thermal conductivity.

The reference numbers identifying each of the various elements which comprises each of the subsensors 14–17 have been applied to subsensor 14. Explanation of the subsensors forming the device will be with reference to subsensor 14, and unless otherwise stated comments with respect to it are true also for each of the other subsensors 15–17 comprising sensor 11 and the subsensors comprising sensor 12, etc.

Subsensor 14 is shown in FIG. 1 as having a cold, or reference junction 50 and a hot or sensing junction 47. Reference junction 50 is formed by a first thermocouple element 34 which slightly overlaps a second thermocouple element 33 as shown in FIG. 2, creating intimate electrical contact between them. Each of elements 33 and 34 comprise a different conductive material. Sensing junction 47 is formed by a third thermocouple element 29 which slightly overlaps a fourth thermocouple element 28 as shown in FIG. 2, and also creates intimate electrical contact between them. Thermocouple elements 28 and 34 both comprise a part of layer 26 and are formed of the same thermocouple material. Thermocouple elements 28 and 34 also serve as first and second output terminals for the signal from each subsensor. Elements 29 and 33 both comprise a part of layer 32 and are formed of the same thermocouple material, a material which is different from that forming layer 26. The material forming layer 32 may be nickel-iron for example, and that forming layer 26 may be chromium. Other pairs of metals or semiconductors are also known to be suitable for use as thermocouple elements. However, it is important that they be suitable for use in photolithographic or other types of deposition processes which may be used in forming these arrays.

Thermocouple layers 26 and 32 and the elements comprising junctions 47 and 50 are formed on the underlying support layer 42 as a part of the photolithographic manufacturing process. Layer 42 lies on the thicker heat sink layer 19. Junction 47 and the portion of support layer 42 underlying junction 47 extend over a small cavity or pit 24 in substrate layer 55 which provides a measure of thermal insulation between junction 47 and layer 55. Layer 42 adds strength to the portion of subsensor 14 overlying cavity 24. The surface of subsensor 14 facing away from cavity or pit 24 forms a radiation-responsive surface of subsensor 14.

The reference junction 50 of each subsensor 14–17 is carried on an area of layer 42 which lies directly on and is in close thermal connection with support layer 42 and heat sink layer 19. There is good thermal conductivity between junction 50 and substrate layer 55, so that when radiation impinges on a subsensor, there will be a temperature differential between the sensing and reference junctions.

To further increase the temperature differential between the sensing junction 47 on the one hand, and the reference junction 50 and the heat sink layer 19, during fabrication slots 35 and 36 are formed in layers 26 and 42, and slots 37 and 38 are formed in layers 32 and 42 adjacent sensing junction 47. For maximum thermal isolation, It is important that slots 35 and 38 each straddle an edge of pit 24 as shown. This arrangement creates bridges 44 and 45 which suspend sensing junction 47 above pit 24 so as to provide relatively long heat conduction paths of relatively small cross sectional area between layer 19 and sensing junction 47. There are other equally suitable configurations for providing thermal isolation of sensing junction 47 from heat sink layer 19. It should be noted that this thermal isolation feature is not the main feature of this invention.

The four subsensors 14–17 comprising sensor 14 are shown in FIGS. 1 and 2 in series connection with layer 26 connecting reference junction 50 of subsensor 14 to sensing junction 47 of subsensor 15. A bridge 38 forming a part of layer 26 connects reference junction 50 of subsensor 15 to sensing junction 47 of subsensor 17. Connectors 52 and 53 form vias passing through layers 42 and 19 to respectively connect sensing junction 47 of subsensor 14 and the reference junction of subsensor 16 to signal processing circuitry within layers 57. Connectors 52 and 53 may alternatively be used for connection to external circuitry.

In operation, infrared radiation shown symbolically in FIG. 2 as rays 45 impinges on both the sensing and the reference junctions of each of the subsensors 14–21. Because of the differing thermal conductivities between the sensing junction 47 of a subsensor 14–17 and heat sink layer 19, and the associated reference junction 50 of the same subsensor 14–17 and heat sink layer 19, a change in the intensity of infrared radiation which falls on the radiation-responsive surface of subsensor 14 and its sensing junction 47 and reference junction 50 will alter the temperature differential between the two junctions. As noted above, this temperature differential is very slight but is sufficient to create a small signal voltage between element 28 of subsensor 14 and element 32 of subsensor 16, which signal varies as a function of the change in intensity of the infrared radiation impinging on a sensor 11, 12, etc. The different temperature differentials within a pixel area are averaged by the signal resulting from the series connection between the subsensors 14–17. Where the changes in intensity of impinging infrared radiation on different sensors is different, the resulting voltage signals will also differ allowing an image of the infrared radiation pattern to be electronically constructed. In order to be able to provide real time images of the infrared radiation pattern, it is important that the thermal mass of the material suspended above cavities 24 be very small, so that the temperature of junction 47 can change very quickly relative to that of junction 50 in response to changes in the level of impinging radiation.

FIG. 3 shows a series-parallel connection of four subsensors in each sensor 11, 12, etc. Signal conductor 71 is connected to the connector 38 shown in FIGS. 1 and 2, and elements 28 and 34 of respective subsensors 14 and 16 are connected electrically by a conductor 70 which may be a part of layers 26 and 32. Connectors 53 and 71 for each sensor 11, 12, etc. then provide to a signal processor 75 the signal representing the changes in intensity of infrared radiation falling on the sensors 11, 12, etc. An advantage of such an arrangement is that if one of the subsensors should open electrically or be defectively manufactured, an attenuated signal will still be provided, which may then be enhanced if necessary in order to provide a reasonably good image. In this way, occasional defects in the subsensors will not result in high scrap rates for the complete array. It is also possible to connect all of the subsensors in parallel to further reduce the effect of electrically open subsensors. This configuration will reduce the internal impedance of the individual sensors.

The preceding describes our invention. The matter which we wish to claim and protect by letters patent is:

1. An infrared radiation sensing array comprising
   a) a substrate having on a first surface, a plurality of pixel areas, a plurality of pixel areas arranged in an array;
   b) within each pixel area, a sensor comprising a plurality of infrared sensitive microbridge subsensors arranged in a sub-array, each subsensor spanning an underlying pit and having first and second output terminals across which appears a voltage responsive to presence of infrared radiation impinging on a radiation-responsive surface of the subsensor, at least one of said subsensors within a pixel area having its radiation-responsive surface facing away from the pit within the pixel area;
   c) within each pixel area, a plurality of subsensor conductors electrically connecting the subsensors in that pixel area together in a predetermined manner which provides a composite signal to which each subsensor contributes electrical energy; and
   d) a plurality of sensor output conductors, each one associated with a single sensor, and carrying the composite signal produced by that sensor.

2. The array of claim 1, wherein the conductors within a pixel area connect at least two subsensors within that pixel area in series connection with each other.

3. The array of claim 2, wherein each subsensor includes a sensing junction and a reference junction, and wherein the conductors forming the series connection between two subsensors are integral with the elements forming the reference junction of one series-connected subsensor and the sensing junction of another series-connected subsensor.

4. The array of claim 1, wherein the conductors within a pixel area connect at least some of the subsensors within that pixel area in parallel connection with each other.

5. The array of claim 1, including a signal processor connected to the sensor output conductors.

* * * * *